(12) United States Patent
Estan et al.

(10) Patent No.: US 9,269,411 B2
(45) Date of Patent: Feb. 23, 2016

(54) ORGANIZING DATA IN A HYBRID MEMORY FOR SEARCH OPERATIONS

(71) Applicant: Broadcom Corporation, Irvine, CA (US)

(72) Inventors: Cristian Estan, Sunnyvale, CA (US); Mark Birman, Los Altos, CA (US); Prashanth Narayanaswamy, Milpitas, CA (US)

(73) Assignee: Broadcom Corporation, Irvine, CA (US)

( * ) Notice: Subject to any disclaimer, the term of this patent is extended or adjusted under 35 U.S.C. 154(b) by 418 days.

(21) Appl. No.: 13/730,034

(22) Filed: Dec. 28, 2012

(65) Prior Publication Data

US 2013/0246697 A1     Sep. 19, 2013

Related U.S. Application Data

(60) Provisional application No. 61/610,720, filed on Mar. 14, 2012, provisional application No. 61/636,144, filed on Apr. 20, 2012.

(51) Int. Cl.
| | |
|---|---|
| *G06F 12/00* | (2006.01) |
| *G11C 7/10* | (2006.01) |
| *G06F 17/30* | (2006.01) |
| *G11C 15/00* | (2006.01) |

(52) U.S. Cl.
CPC ........ *G11C 7/1072* (2013.01); *G06F 17/30982* (2013.01); *G11C 15/00* (2013.01)

(58) Field of Classification Search
CPC ................................ G06F 12/00; G06F 3/068
USPC .................................. 711/100, 104, 154, 170
See application file for complete search history.

(56) References Cited

U.S. PATENT DOCUMENTS

| | | | |
|---|---|---|---|
| 7,353,360 B1 * | 4/2008 | Muller et al. | 711/203 |
| 7,889,734 B1 * | 2/2011 | Hendel et al. | 370/392 |
| 8,522,348 B2 * | 8/2013 | Chen et al. | 726/23 |
| 2006/0262583 A1 * | 11/2006 | Venkatachary | 365/49 |

* cited by examiner

*Primary Examiner* — Tuan Thai
(74) *Attorney, Agent, or Firm* — Sterne, Kessler, Goldstein & Fox P.L.L.C.

(57) ABSTRACT

Methods, systems, and computer readable storage medium embodiments for configuring a lookup table, such as an access control list (ACL) for a network device are disclosed. Aspects of these embodiments include storing a plurality of data entries in a memory, each of the stored plurality of data entries including a header part and a body part, and encoding each of a plurality of bit-sequences in the header part of a stored data entry from the plurality of data entries to indicate a bit comparing action associated with a respective bit sequence in the body part of the stored data entry. Other embodiments include searching a lookup table in a network device.

20 Claims, 12 Drawing Sheets

ORGANIZING DATA IN A HYBRID MEMORY FOR SEARCH OPERATIONS

CROSS REFERENCE TO RELATED APPLICATIONS

This applications claims the benefit under 35 U.S.C. §119(e) of U.S. Provisional Appl. No. 61/610,720, filed Mar. 14, 2012, and U.S. Provisional Appl. No. 61/636,144, filed Apr. 20, 2012, which are hereby incorporated by reference in their entireties.

BACKGROUND

1. Field of the Invention

Embodiments relate to searching the memory of processor-based devices.

2. Background Art

Search efficiency is crucial for many computing functions including for packet processing in network devices, such as bridges, switches, routers, gateways, network proxies, network load balancing devices, and network security devices. One or more searches are performed for each packet at each hop along a network path, based upon the respective headers, to determine, for example, a next hop to which the packet is to be forwarded and/or to determine whether the packet can be forwarded based upon access control rules.

As computer networks grow, scalability issues arise with respect to search efficiency, search table size, and power consumption. Search tables generally increase in size with the growth in network size. As search tables grow, their power consumption may also increase because some types of search tables, such as tables implemented in content addressable memory (CAM), consume large amounts of power.

CAM-based lookup tables are frequently used for fast search operation. Many network devices, such as those noted above, use a CAM or a ternary CAM (TCAM) for routing based upon a longest prefix match of network IP addresses and for access control list (ACLs) lookup operations.

A CAM enables comparing an input search expression (e.g., search key) to a plurality of stored entries simultaneously. Thus, determining one or more matching entries in a CAM is substantially faster than in memories such as random access memory (RAM) which are accessed using memory addresses. A TCAM provides the same ability to compare the search key simultaneously to multiple stored data entries as a CAM, and in addition enables some fields to be marked as "don't care" or wildcards, effectively allowing those fields to match any value in the corresponding field of the search key. However, although CAMs and TCAMs are fast, they consume large amounts of power relative to other types of memory. The size of a CAM or TCAM directly affects the power consumption associated with that memory.

In order to address the ongoing growth of search table size, requirements for reduced power consumption, and faster packet forwarding, systems and methods are desired for more efficient use of CAM and other memory resources for lookup operations.

BRIEF DESCRIPTION OF THE DRAWINGS/FIGURES

Reference will be made to the embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE INVENTION

While the present disclosure is described herein with reference to illustrative embodiments for particular applications, it should be understood that the invention is not limited thereto. Those skilled in the art with access to the teachings herein will recognize additional modifications, applications, and embodiments within the scope thereof and additional fields in which the invention would be of significant utility.

Embodiments are directed to performing large table lookups at high throughput in a power efficient manner. Methods, systems, and computer readable storage medium embodiments for configuring a lookup table for a network device are disclosed. Aspects of these embodiments include storing a plurality of data entries in a memory, each of the stored plurality of data entries including a header part and a body part, and encoding each of a plurality of bit-sequences in the header part of a stored data entry from the plurality of data entries to indicate a bit comparing action associated with a respective bit sequence in the body part of the stored data entry.

Embodiments also include searching a lookup table in a network device. Aspects of these embodiments include receiving a search key and a first memory address, accessing a fixed-length metadata tag at the first address, retrieving a group of stored data entries using a second memory address encoded in the fixed-length metadata tag, comparing each bit sequence from the search key to a respective bit sequence from each stored data entry from the group based upon a bit comparing action encoded in a corresponding bit sequence in a header part of the stored data entry, and selecting one of the stored data entries based upon the comparing.

This disclosure provides for a hybrid memory device (which may be referred to as a "hybrid memory") which includes a CAM, such as a TCAM, and a second memory, which may be a random access memory (RAM) such as a static RAM (SRAM), dynamic RAM (DRAM), or embedded DRAM. The hybrid memory device is configured to perform searches of very large lookup tables in a power-efficient manner. The hybrid memory device and its associated logic may be used for lookup operations such as those associated with access control lists (ACL). In embodiments, most of the ACL entries are stored in the second memory of the hybrid memory device, using the CAM to store pointers to the ACL entries stored in the second memory. A decision tree based approach is used to determine groups of ACL entries to be stored together and to form the pointers to be stored in the CAM. Embodiments enable the use of large tables in, for example, packet classification using ACL, at high speeds with relatively low power consumption.

Figure 1:
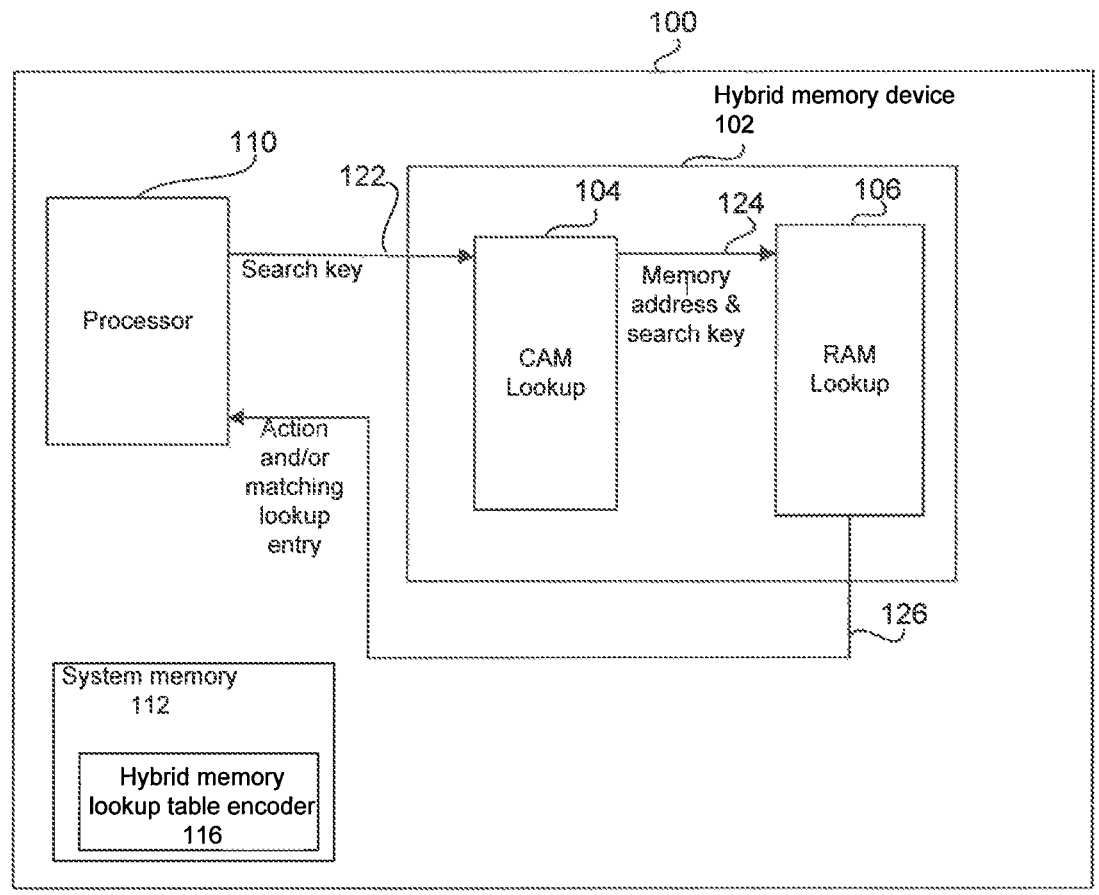
FIG. 1 illustrates a block diagram of a search system, in accordance with an embodiment.

FIG. 1 illustrates a block diagram of a search system 100, in accordance with an embodiment. System 100 includes a hybrid memory device 102 coupled to a processor 110. Hybrid memory device 102 includes a CAM lookup block 104 and a RAM lookup block 106. Processor 110 transmits a search key to hybrid memory device 102 over interface 122 and receives an action or a lookup table entry that matches the search key from hybrid memory device 102 over an interface 126. In addition to blocks 104 and 106, hybrid memory device 102 may include one or more other processors and/or logic blocks. In some embodiments, hybrid memory device 102 is formed on a single chip. In some other embodiments, hybrid memory device 102 may include two or more chips and/or other components of an attached computing system, such as system 100. System 100 may be part of a bridge, switch, router, gateway, server proxy, network load balancing device, network security device, or other network packet processing device.

Hybrid memory device 102 is configured to store tables of data entries, such as, but not limited to, one or both forwarding table entries and ACL entries. The data entries are stored in such a way that a combined operation involving both CAM lookup block 104 and RAM lookup block 106 is performed to find and access the desired data entry. Hybrid memory device 102 is configured such that the ACL entries can be accessed in a manner that is power efficient and provides low latency.

Forwarding table lookup operations involve the comparing of a destination Internet protocol (IP) address to a plurality of stored IP addresses. The comparison is to determine the longest prefix match (LPM) to the destination IP address among the stored entries. The LPM of the destination IP address corresponds to the table entry that has the largest number of leading (e.g., leftmost) bits matching the destination IP address.

ACLs classify and filter network traffic. In contrast to LPM, ACL table entries may not have the fields or bits to be compared arranged contiguously in a data entry. An ACL entry typically includes several fields, such as, source and destination Internet Protocol (IP) addresses, source and destination port numbers, protocol numbers, service classes, virtual local area network identifiers (VLANIDs), customer specific fields etc. When a packet is compared to the ACL, each entry may specify one or more fields to be compared against the packet. The packet will be considered as matching an ACL entry if the packet, or more specifically the search key generated from the packet, matches all of the fields to be matched in that ACL entry. As noted above, the fields to be matched with respect to one ACL entry may only be a subset of the fields that are present in the search key. Additionally, ACL lookup, in contrast to longest prefix match, can include numerical comparisons, range matches etc. Also, entries in ACL tables are ordered and matched based on priority.

Thus, whereas with respect to LPM, any fields or bits to be ignored (i.e., fields or bits not used in the comparison) occur after the prefix that is used for comparison, in ACL the ignored fields or bits can occur anywhere. This Characteristic of ACL, makes searching ACL significantly different from searching forwarding tables based on LPM.

Processor 110 can be a network processing unit (NPU) or other processor. Processor 110 is configured to use hybrid memory device 102 for some or all of its search operations. For example, processor 110 may rely upon hybrid memory device 102 for all of its forwarding table lookups and ACL lookups. Upon receiving a packet for which a table lookup, such as a forwarding table lookup or ACL lookup, is required, processor 110 may submit the search to hybrid memory device 102. Processor 110 may form a search key (e.g., search expression or search bit string) from the packet's header fields which is then submitted to hybrid memory device 102.

In the hybrid memory device 102, the search key is first processed in CAM lookup block 104. CAM lookup block 104 includes one or more CAM (or TCAM) memories and logic for storing and accessing the CAM or TCAM memories in accordance with embodiments described herein. CAM lookup block 104, as described below, may include only a portion of the fields to be matched to the search key. CAM lookup block 104 yields a memory address in the RAM lookup block 106. The search key and the memory address returned from CAM lookup block 104 are then submitted over an interface 124 to RAM lookup block 106, which includes the RAM storing the data entries and priority information associated with the data entries. RAM lookup block 106 also operates to store and access data entries in the one or more RAM memories, and to select one or more of the matching entries based upon priority, RAM lookup block 106 yields a matching data entry stored in RAM which corresponds to the search key. An action associated with the matching data entry or the matching data entry is then returned to processor 110.

System 100 also includes a system memory 112 and a hybrid memory lookup table encoder 116. System memory 112 is interconnected through one or more data and control busses (not shown) to components of system 100. System memory 112 can include a volatile memory, persistent memory, or combinations thereof. Exemplary volatile memory includes DRAM and SRAM. Exemplary persistent memories include FLASH memories, magnetic disks, optical disk, etc.

Hybrid memory lookup table encoder 116 includes logic to form the decision tree discussed above, to encode the decision tree in hybrid memory device 102, and to store lookup tables and other data entries in accordance with embodiments. The logic instructions from hybrid memory lookup table encoder 116 may be stored in a computer readable storage medium such as memory 112.

Figure 2:
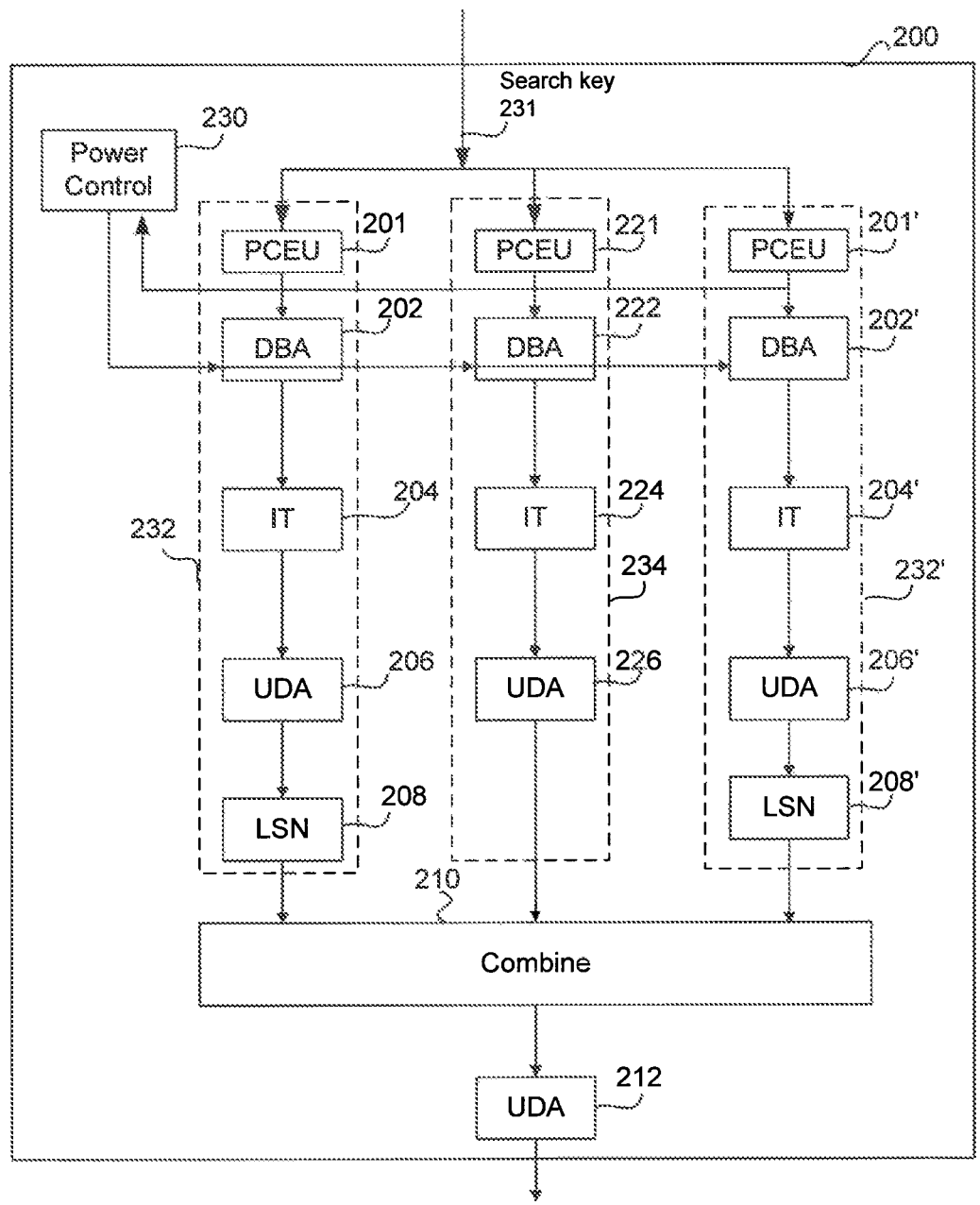
FIG. 2 illustrates a block diagram of a hybrid memory device, in accordance with an embodiment.

FIG. 2 illustrates a block diagram of a hybrid memory device 200, in accordance with an embodiment. The illustrated hybrid memory device 200 includes three execution paths 232, 232' and 234. The execution paths may proceed in parallel to perform respective search operations based upon the same search key 231. Execution path 232' is configured to duplicate the processing logic of execution path 232. In other embodiments, each of the paths 232 and 234 may be duplicated to yield a hybrid memory device with multiple parallel execution paths. Hybrid memory device 200 may be an implementation of hybrid memory device 102.

Execution path 232 includes a database block array (DBA) 202, information table (IT) 204, a user data array (UDA) 206, and linear search node (LSN) 208. Similarly to execution path 232, execution path 232' includes DBA 202', IT 204', UDA 206' and LSN 208'. Execution path 234 includes DBA 222, IT 224 and UDA 226. Optionally execution paths 232, 232' and 234 may have respective power control and encoding units (PCEU) 201, 201' and 221.

Moreover, the results of execution paths 232, 232' and 234 are processed by a combine unit 210. Another UDA 212 includes the logic to retrieve the memory location(s) of associated data from the matching data entry as determined by combine unit 210. UDA 212 may include another access to the same (multi-ported) shared SRAM that is accessed earlier in the pipeline. A power control unit 230 includes logic to perform power control operations throughout hybrid memory device 102.

Execution paths 232 and 232' are each intended to cover a larger portion of the lookup data than execution path 234. Specifically, execution paths 232 and 232' are used to access lookup entries in accordance with one or more decision trees constructed from a collection of data entries, and execution path 234 is used to access the "outliers" or data entries that did not get included in the constructed one or more decision trees. In some embodiments, in paths 232 and 232' entries are stored in the UDA, and in path 234 entries are stored in the DBA.

DBA 202 includes a TCAM that has encoded in it paths from the one or more decision trees constructed from a collection of lookup data entries. For example, a decision tree is constructed from a large ACL. DBA 202 includes logic to store the decision tree, or more specifically, paths from the decision tree, in the TCAM, and to access the TCAM to match a search key to the decision tree paths encoded in the TCAM. DBA 222 includes a TCAM that encodes the outlier data entries. DBA 222 includes logic to store and to access the outlier data entries stored in the TCAM. DBA 202', similarly to DBA 202, includes a TCAM that has encoded in it a second decision tree constructed from the collection of lookup data entries. The construction of decision trees from the collection of lookup data entries, the determination of outliers, and encoding of the decision tree in the TCAM, are described below in relation to FIG. 3 and FIGS. 6-8. The looking up of the TCAM for a search key is described below in relation to FIG. 9.

IT 204 provides a mapping from an index to a range of addresses in memory. For example, IT 204 may be configured with an entry for each index that may be returned by DBA 202, and the entry would identify a corresponding area in a memory. The memory area may be identified using a start address in an RAM memory, and, in some embodiments may also include either a size of the memory area or an end address.

UDA 206 operates to access a RAM using the address information from IT 204. For example, a start address and a size returned by IT 204 may be used to access the RAM.

LSN 208 operates to search the memory blocks accessed in the RAM. According to one embodiment, the accessed memory area or portions thereof are copied to a separate area for processing by LSN 208.

The LSN 208 processing compares the search key to each data entry stored in the accessed area of the RAM, and would yield one or more matching data entries, if any. The processing of UDA 206 and LSN 208 are further described in relation to FIGS. 5 and 9-12 below.

Combine unit 210 operates to select one or more of the data entries from the memory entries accessed in RAM. In some embodiments, combine unit 210 returns exactly one data entry. The selection is based upon a comparison of the priorities of each data entry that is found to be matching the search key.

The search operation is completed when the one or more selected entries are returned from combine unit 210.

The one or more selected data entries returned from the combine unit 210 can then be used to access the RAM in UDA 212 in order to retrieve the contents (e.g., associated data) at the location indicated by the one or more selected entries returned from the combine unit 210. UDA 212, for example, may operate to access a read only location or a read-modify-write operation upon the indicated memory location.

The above description of units 202-208 relates to processing path 232. As noted above, the same search key may be processed in parallel by paths 232, 232' and 234. Thus, a similar sequence of processing units 202'-208' may operate as path 232' in parallel to path 232.

In the third parallel path 234, a TCAM lookup is performed in DBA 222 to yield an index of a matching data entry. Unlike in DBA 202 and 202', the TCAM accessed by DBA 222 stores the entirety of each of the outlier data entries. The index is then used in IT 224 to map to an address in a RAM. In UDA 226, the address determined in IT 224 is used to access information such as priority information regarding the matching data entry returned by DBA 222.

As noted above, the data entries selected in LSN 208, 208' and UDA 226 are processed in combine unit 210 to select one or more selected data entries, which may then optionally be used to access the memory again in UDA 212 to obtain the content at the selected memory location. As described above, the selection of the one or more data entries in combine unit 210 is based upon the priority associated with each matching data entry returned from the one or more execution paths 232, 232' and 234.

PCEU 201, 201', and 221, with power control unit 230, operate to configure the TCAMs and/or the search keys submitted to each of the execution paths 232, 232' and 234, in order to improve power consumption. Power control unit 230 and PCEU units 202, 201' and 221 operate to reduce the power consumption associated with the TCAM lookups in DBA 202, 202' and 222. According to an embodiment, power control 220 includes logic to determine which of the blocks of entries in the massively parallel arrays can be ignored in view of each received search key, and those blocks may not be powered on for the lookup. PCEU 201, 201' and 221 may, in some embodiments, operate to configure the search key or copies of the search keys in accordance with the particular TCAM which is being looked up. For example, TCAMs associated with DBA 202 and 202' may not store the full width of the data entries because only a path to a leaf needs to be stored, and therefore, some power savings may be achieved by looking up only the portion of the search key that corresponds to the stored path information.

Figure 3:
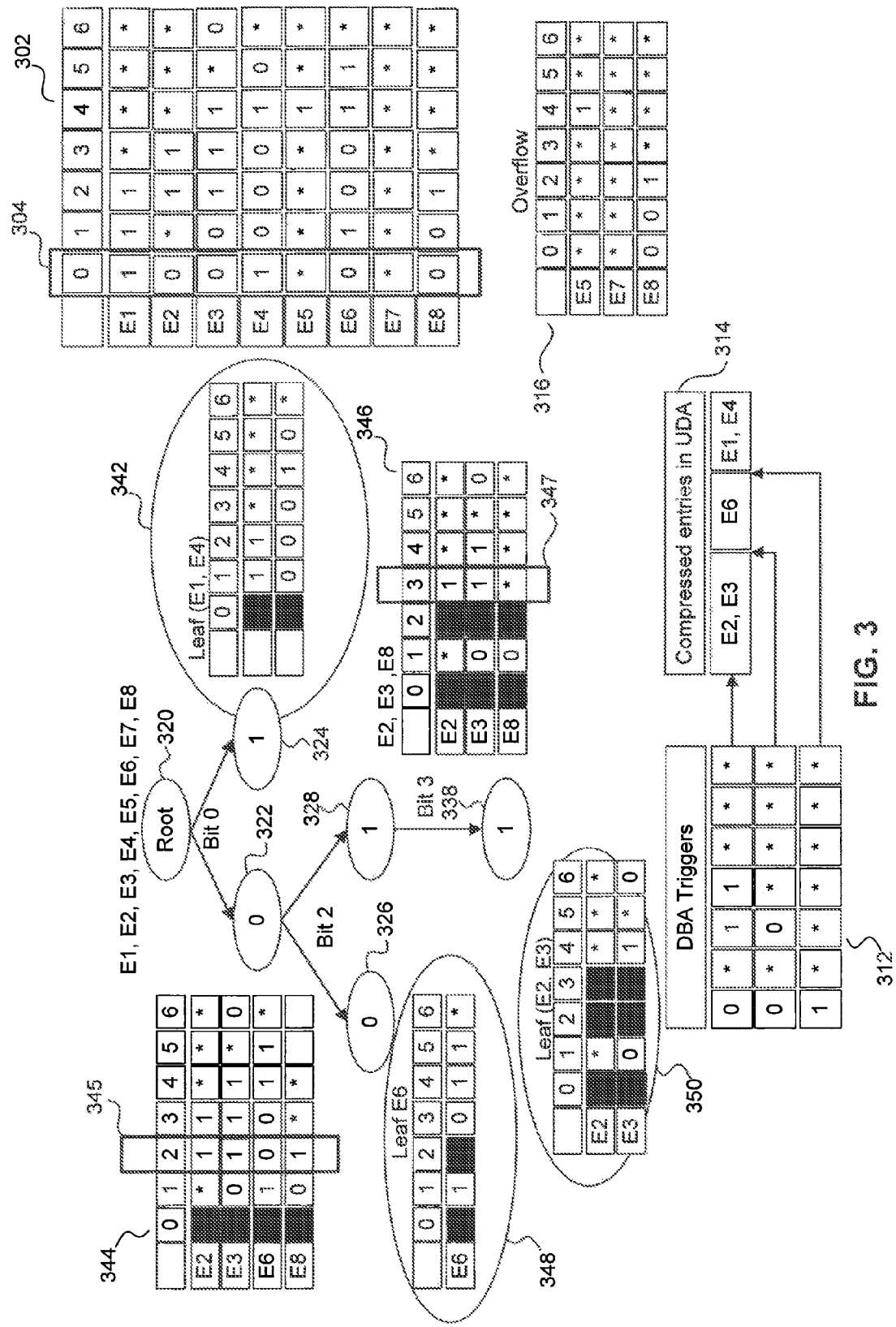
FIG. 3 illustrates a decision tree approach to storing data entries in the hybrid memory device of FIG. 2, in accordance with an embodiment.

FIG. 3 illustrates the forming of triggers, or paths in decision trees, that are stored in the DBAs 202 and 202', according to an embodiment. The triggers stored in DBA 202 and 202' are paths in a decision tree formed based upon a collection of data entries, and point to data entries stored in UDA 206 and 206'.

As noted above, the collection of data entries may correspond, for example, to a large table of ACL data entries.

As illustrated, table 302 includes rows E1-E8 each having 7 bits identified as bit positions 0-6. A person skilled in the art would appreciate that table 302 is exemplary and only for illustration, and that an ACL table, LPM table, or other lookup table may, for example, have wider (e.g., more bits) or narrower (e.g., less bits) data entries, and may also have more or less data entries than shown in table 302. Embodiments may be used with ACL tables having any number of entries, including those having millions of entries of any width. Advantages of the disclosed embodiments relative to conventional techniques become more evident when large tables are encoded in the hybrid memory. The decision tree forming technique may be illustrated with reference to table 302.

The decision tree creation begins by initializing a root node 320, which is associated with bit position 0 in table 302. The decision tree creation terminates when the number of data entries represented at every leaf node is less than a threshold number. In the example illustrated in FIG. 3, the threshold is set to 2 entries, i.e., the decision tree is complete when the number of data entries from table 302 represented at each leaf node is 2 or less. Initially, all entries E1-E8 are considered to be represented at the root 320.

The column 304 corresponding to bit position 0 includes entries E1 and E4 that have a bit value of 1, entries E2, E3, E6, and E8 having bit value 0, and entries E5 and E7 having a bit value of "don't care". Thus, entries E1 and E4 are assigned to, or represented at a first child 324 of root 320; entries E2, E3, E6, and E8 at a second child 322 of root 320; and E5 and E7 added to a set of outliers or entries that would not be represented in the decision tree that is being constructed. Thus, by considering bit position 0 in table 2, the root node was split by adding two child nodes. Splitting the node includes entirely draining the node of its entries, and assigning the drained entries to the two children and to the overflow.

Next, it is determined whether each of the nodes 322 and 324 should be split by adding child nodes. Node 324 represents only two data entries 342 and is therefore within the threshold. Thus, node 324 requires no further splitting, and is considered a leaf node. Node 322 however represents 4 nodes, and would therefore be split by adding child nodes.

In the table 344 of data entries represented at node 322, the yet unconsidered column with the lowest number of "don't care" bits is column 345. As illustrated column 345, or bit position 2 in table 344, has no "don't care" bits, and is therefore selected as the next bit position. Note that bit position 1 was considered and skipped in favor of bit position 2 which has fewer "don't care" bits than at bit position 1.

Thus, node 322 is split by adding a first child 328 representing entries E2, E3 and E8 that have a bit value of 1 in bit position 2 from table 344, and a second child 326 representing data entry E6 which has a bit value of 0 in bit position 2. Note that in splitting the data entries of table 344 at node 322, no entries were added to the set of outliers 316 because none of the entries in table 344 had a bit value "don't care" in position 2.

Next, the newly added nodes are considered. Node 326 represents only a single data entry (E6) 348 and is therefore considered a leaf. But, node 328 represents 3 entries in its table 346 of entries, and is therefore considered for splitting by adding child nodes.

The yet unconsidered leftmost column with the least number of "don't care" bits is now at bit position 3. The column 347, at bit position 3, has one "don't care" bit. Therefore node 328 will be split by adding child nodes based column 347.

Considering column 347, entries E2 and E3 have a bit value of 1, and entry E8 has a bit value of "don't care". Thus a first child 338 is added to node 328 with entries E2 and E3. No second child is added to node 328 because no entries in table 346 have bit value 0 in column 347. Entry E8 is added to the set of outliers.

Next, when all non-intermediate nodes are considered, all current leaf nodes have two or less entries, and are therefore at or below the threshold. For example, the newly added node 338 has two entries 350. Therefore, the decision tree has been fully formed.

When the decision tree has been fully formed in accordance with the termination criteria, the triggers to be encoded in the TCAM can be determined. The data entries from table 302 that are represented in the decision tree are stored in one or more areas 314 in RAM.

Each of the triggers 312 is a bit representation of a path from the root of the decision tree to a leaf. For example, the trigger "0 * 1 1 * * *" corresponds to the path from root 320, through nodes 322 and 328 to leaf 338. The "don't care" hit value in bit position 1 indicates that the first bit position was skipped in selecting the columns to form the decision tree.

Trigger "0 * 1 1 * * *", corresponding to leaf 338, is then pointed to entries 350 stored in RAM. Similarly, trigger "0 * 0 * * * *" corresponds to the path from the root to leaf 326, and is set to point to entry 348 in RAM, and trigger "1 * * * * * *" corresponds to the path to node 324 and is set to point to entries 342 in RAM.

The set of outlier entries 316 are not represented in the decision tree, and are separately encoded in TCAM or in RAM.

According to some embodiments, the outlier may be processed through the same process as that applied to form the first decision tree to form a second decision tree. An example implementation of two execution paths of decision tree encoded TCAMs and one execution path of a TCAM encoded with ACL entries was illustrated above in relation to FIG. 2.

Figure 4:
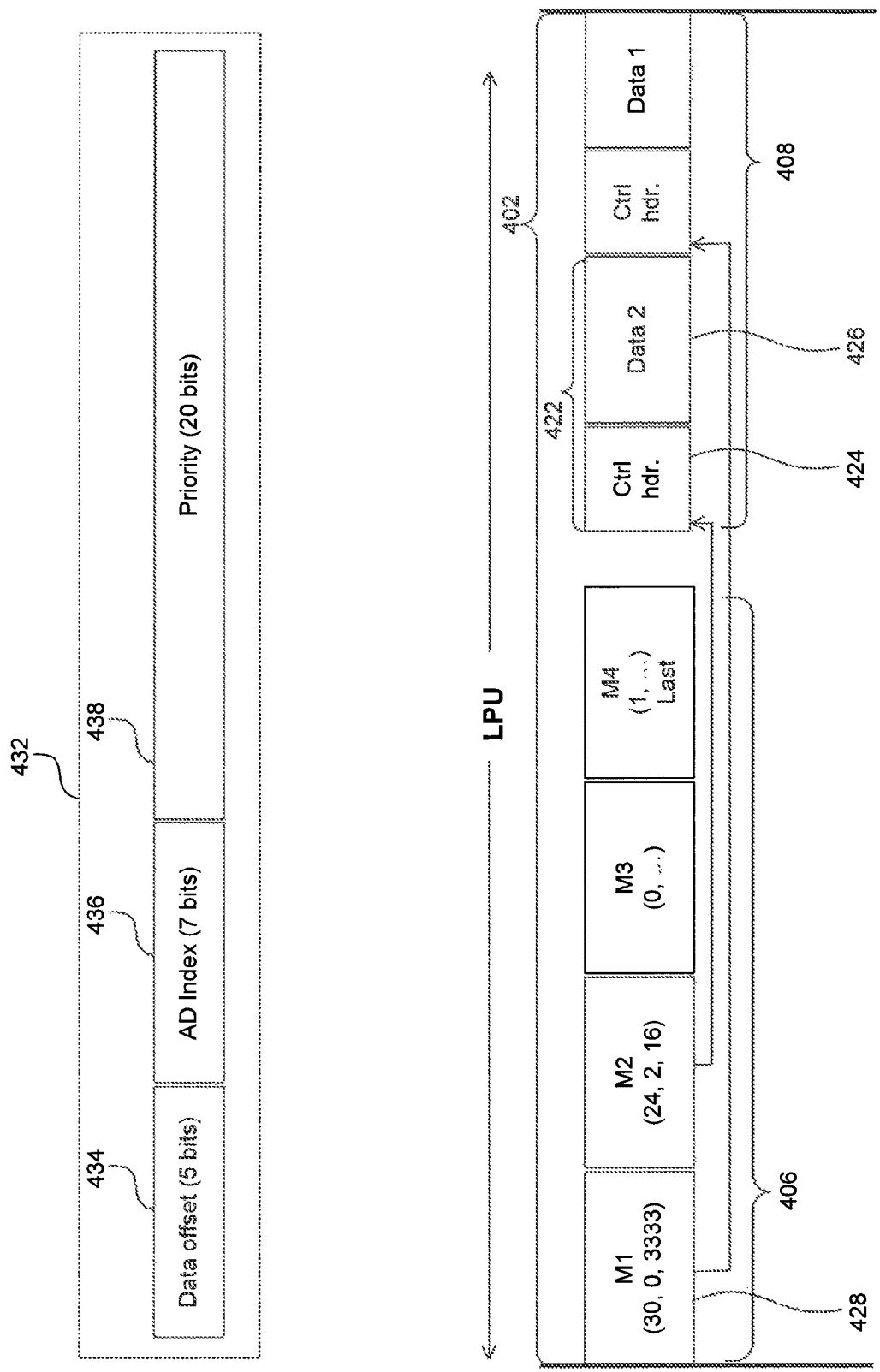
FIG. 4 illustrates data entries stored in a memory of the hybrid memory device of FIG. 2, in accordance with an embodiment.

FIG. 4 illustrates the data entries, such as, for example, ACL entries, stored in RAM, in accordance with an embodiment.

Linear processing unit (LPU) 402 illustrates a block of data that can be read from RAM in order to be compared with a search key. LPU 402 includes a set 406 of fixed-size metadata tags 428 followed by a series 408 of stored data entries 422. Each stored data entry 422 may include, for example, an ACL entry. Each stored data entry includes a header part 424 and a body part 426. The body part 426 includes the ACL entry, while the header part 424 includes a series of fixed-size bit sequences. Each bit sequence encodes a bit comparison action to be performed on a corresponding fixed-size sequence of bits in the body part. According to an embodiment, the bit comparison action specifies the type of comparison to be performed between the corresponding bits in the search key and the data entry and can be any one of exact match, less than, greater than, equal to, in the range of, longest prefix match, or "don't care" The "don't care" match can be considered a "ternary match" as it would match any bit value 1, 0, or "don't care." Metadata tag 428 is stored for each data entry 422. Metadata tags 428 have fixed size, and may have the format shown in 432. A data offset field 434 specifies the location of (e.g., a pointer to) the corresponding data entry in RAM. The priority 438 specifies the priority encoding for the corresponding data entry. AD index 436 specifies where associated data for this entry are stored. According to some embodiments, respective portions of a data entry (e.g., a very wide data entry) can be stored in separate LPUs and one or more of the corresponding headers 424 of the respective portions updated to indicate that the data entry is stored as a split data entry.

Figure 5:
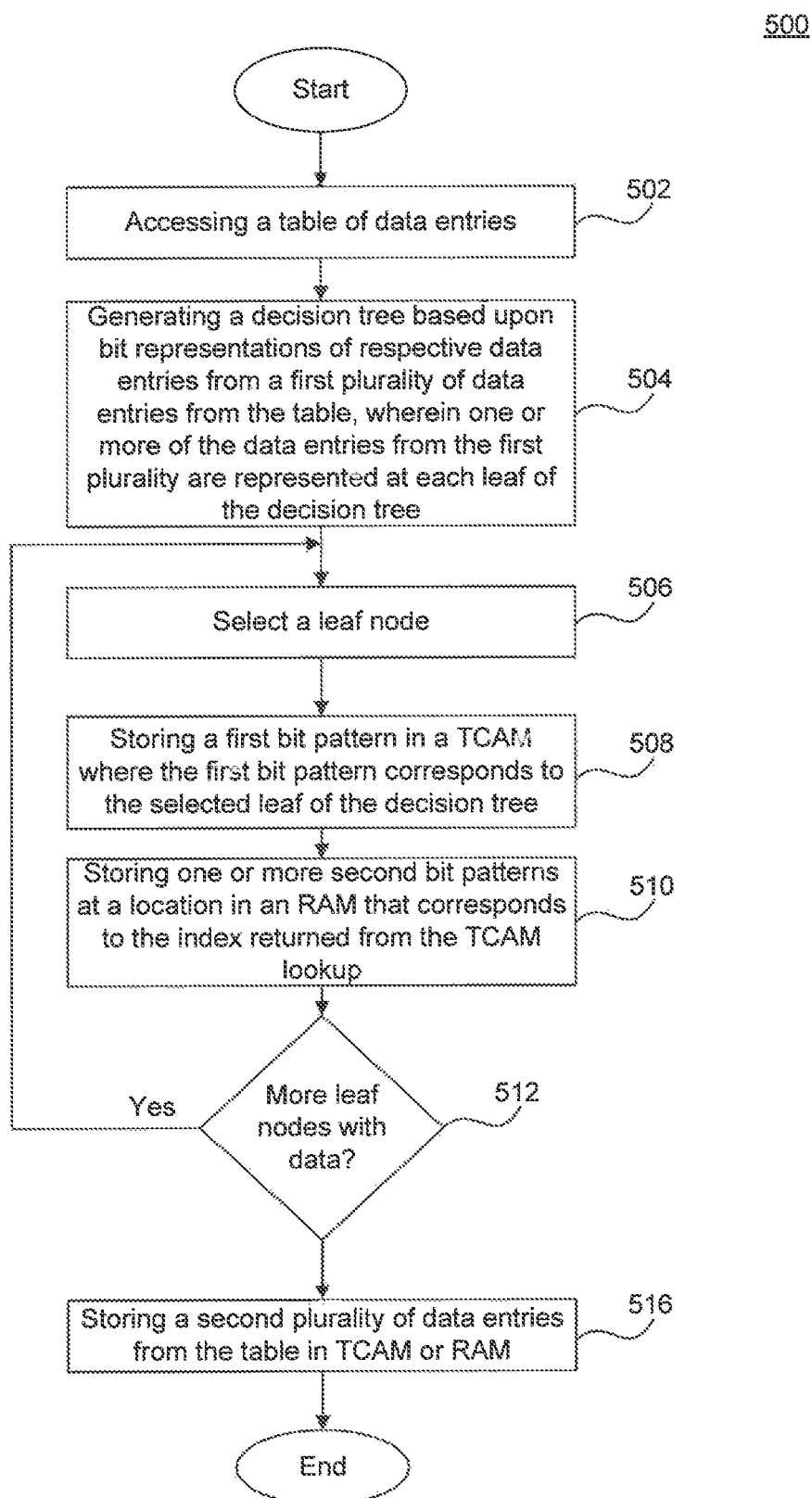
FIG. 5 is a flowchart of a method for storing data entries in the hybrid memory device of FIG. 2, in accordance with an embodiment.

FIG. 5 is a flowchart of a method 500 for storing data entries in a hybrid memory device such as device 102 shown in FIG. 2, in accordance with an embodiment. Method 500 can be used to store a collection of data entries such as, but not limited to, a collection of ACL entries in a device having a CAM and a RAM. More specifically, method 500 operates to arrange most of the AU entries to be stored in RAM and arrange the CAM in accordance with a decision tree derived from the collection of ACL entries to form an index to access the ACL entries in the RAM. Any ACL entries from the collection that are not represented in the decision tree are represented in the CAM as complete ACL entries. The arrangement resulting from method 500 enables the search of very large tables in a time and power efficient manner.

Method 500 is illustrated with steps 502-516. However, it should be noted that one or more steps 502-516 may not be required or may be performed in an order different from that shown in FIG. 5.

At step 502, a collection of data entries is accessed. The accessed collection of data entries may be organized in the form of a table, e.g., each data entry being a row and corresponding fields from respective rows forming columns. The data entries may be ACL entries. An ACL entry may include values for a plurality of fields and an associated processing action. The fields in an ACL entry may correspond to fields in a data and/or control packet header. Each ACL entry may specify a combination of field values that is unique in the collection of data entries, and a processing action to be performed when a packet is encountered with a header that matches the ACL entry. The associated processing action can be, for example, to permit the packet, to deny the packet, or to subject the packet to further processing before a decision is made regarding permitting or denying.

At step 504, a decision tree is formed from the collection of data entries. The decision tree is formed in a manner that one or more of the data entries are represented at each leaf node of the tree. In some embodiments, the number of data entries represented at each leaf is less than or equal to a threshold. The sets of data entries represented at the leaves are mutually exclusive of each other. Moreover, a subset of the entries from the collection may not be represented by any leaf of the decision tree. In yet another embodiment, two or more nodes that each has less than a configured number of data entries represented at the corresponding leaf nodes may be joined. When nodes are joined, data entries represented at the leaf nodes of any subtrees rooted at the individual nodes that were joined can be considered as represented at the joined node. The decision tree forming is described in relation to FIG. 3 above and FIGS. 6-8 below.

After the decision tree is formed, steps 506-512 may be repeated to store the data entries represented in the decision tree in the hybrid memory device. At step 506, a leaf node is selected from the decision tree. At each iteration of step 506, a previously unselected leaf node is selected according to any order including by random selection.

At step 508, a data pattern corresponding to the selected leaf (i.e. the leaf that represents the selected data entry) is stored as an entry in the TCAM. According to an embodiment, the entry stored in the TCAM ("TCAM entry") represents the path from the root of the decision tree to the selected leaf. For example, the bit pattern "0 * 1 1 * * *" representing leaf 338 shown in FIG. 3 is stored in the TCAM.

At step 510, the one or more data entries represented by the selected leaf are stored in the RAM. The location in RAM at which the one or more data entries are stored is configured in a manner that corresponds to the TCAM index of the selected leaf node. For example, data entries E2 and E3 (see item 350 in FIG. 3) that are represented by node 338 is stored in RAM. An indirection table, such as IT 204, can be updated as necessary, for example, to map from the TCAM index corresponding to leaf 338 to the location in RAM where entries E2 and E3 are stored.

At step 512, it is determined whether more unselected leaves remain in the decision tree. If yes, method 500 proceeds to step 506 to select the next leaf node. Otherwise, if all leaf nodes have been stored, method 500 proceeds to step 516.

In another embodiment, where, for example, nodes are joined when leaf nodes have less than a configured number of represented data entries, a non-leaf node may be selected at step 506. Correspondingly, at steps 508-510, a path to the selected non-leaf node can be stored in the TCAM and the data entries represented at the non-leaf node can be stored in RAM.

At step 516, a second plurality of data entries are stored in the TCAM. The second plurality of entries is data entries from the collection of data entries that did not get included in the decision tree. For example, the data entries in table 316 are overflow or outlier entries and have not been included in the one or more decision trees formed at step 504. In this step, the outlier entries are encoded in the TCAM. The outlier entries are stored as complete entries in TCAM. Moreover, in some embodiments, the priority information for each of the outlier entries encoded in the ICAM is written to RAM, and an indirection table such as IT 224 is updated with the mapping from the TCAM index to the location in the RAM where the corresponding priority information is stored.

Figure 6:
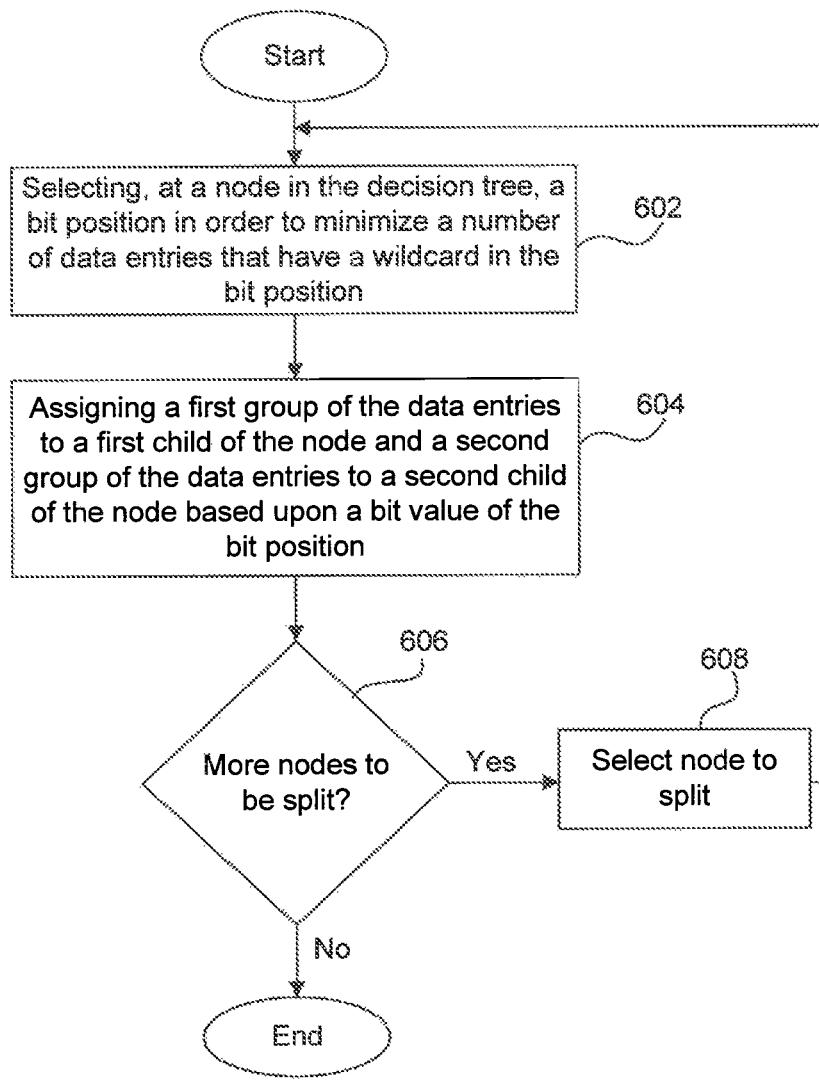
FIG. 6 is a flowchart of a method of adding nodes to the decision tree in the method of FIG. 5, in accordance with an embodiment.

FIG. 6 is a flowchart of a method 600 for adding nodes to the decision tree described in the method of FIG. 5, in accordance with an embodiment. Method 600 may be performed, for example, in step 504 during the building of the decision tree. Specifically method 600 is performed in order to grow the decision tree by dividing the data entries represented at an intermediate node between one or more child nodes. Method 600 results in determining the bit representation of the intermediate node (i.e. bit representation of the path from the root to the intermediate node in the decision tree), and in determining the subsets of the set of data entries represented at the current intermediate node that are allocated to the child nodes of the current intermediate node.

Method 600 is illustrated with steps 602-608. However, it should be noted that one or more steps 602-608 may not be required or may be performed in an order different from that shown in FIG. 6.

Method 600 starts at step 602 by considering a non-intermediate node in the decision tree, such as the decision tree illustrated in FIG. 3. A non-intermediate node, as used herein, is a node which has no children. At step 602, the table of the data entries that are represented at the currently considered non-intermediate node is analyzed to select a column of bits to be associated with the currently considered non-intermediate node. According to an embodiment, the columns are considered in a manner that moves left to right starting with the leftmost column. At each invocation of step 602, the leftmost column that has the least number of "don't care" bits among the columns that have not been previously considered is selected. In other embodiments, alternative techniques for selecting a column, such as by considering groups of multiple bits, may be used.

After the column is selected, at step 604, the data entries that are represented at the currently considered non-intermediate node are divided to one or more groups depending on the bit value of the data entry that corresponds to the selected column. The data entries that have a bit value of 1 in the bit position are collected in a first group, data entries that have a bit value of 0 in the bit position in a second group, and data entries that have a bit value of "don't care" in the bit position in a third group.

At step 606, the non-intermediate nodes, including the nodes that were newly added in step 604, are checked to determine whether any of them should be split (i.e., provided with one or more child nodes). The check may be performed in accordance with the method illustrated in FIG. 8. If any of the non-leaf nodes are to be split, then at step 608, one of those non-intermediate nodes are selected for processing, and method 600 proceeds to step 602 to process the newly selected node.

If, at step 606, it is determined that none of the non-intermediate nodes are to be split, then method 600 ends. When method 600 ends, the decision tree formation is complete. Non-intermediate nodes can then be identified as the leaf nodes of the decision tree.

Figure 7:
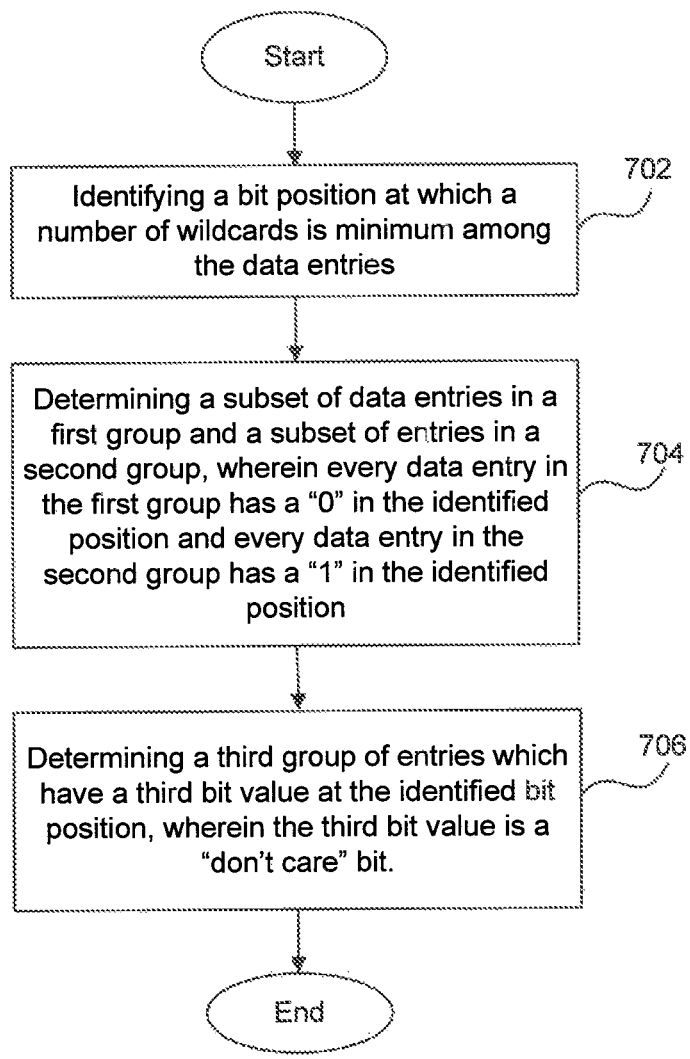
FIG. 7 is a flowchart of a method of determining the path to be assigned to a node in the decision tree of FIG. 5, in accordance with an embodiment.

FIG. 7 is a flowchart of a method 700 of determining the subsets from the set of data entries currently represented by a non-intermediate node in the decision tree of FIG. 5, in accordance with an embodiment. Method 700 may be performed, for example, during step 602 of method 600.

Method 700 is illustrated with steps 702-706. However, it should be noted that one or more steps 702-706 may not be required or may be performed in an order different from that shown in FIG. 7.

At step 702, the set of data entries currently represented by the current non-intermediate node is analyzed to identify a bit position to be associated with the current non-intermediate node. The identified bit position is the column of bits having the minimum number of "don't care" bits among the columns that have not been considered for selection or selected so far. Each time method 700 is invoked, the columns are considered left to right, starting from the column last selected. It should be noted that one or more columns may be skipped in moving from left to right in order to select the column with the minimum "don't care" bit values.

For example, as described above in relation to FIG. 3, when considering whether to split node 322, the table 344 which is the set of data entries represented by node 322 is analyzed to find column 345 which has the minimum "don't care" values among the columns that are yet to be considered. Note that the second bit position was skipped because column 345 had fewer "don't care" values.

At step 704, one or more of a first and a second group are determined. The first group includes all remaining unallocated data entries that have a bit value of 1 in the selected column. The second group includes all remaining unallocated data entries that have a bit value of 0 in the selected column.

At step 706, of the data entries that are assigned to the node those that have a third bit value, e.g. of "don't care", are used to form a third group of data entries. For example, as described in relation to FIG. 3 above, the data entries that have "don't care" values in the column selected for adding child nodes form an overflow table 316.

Figure 8:
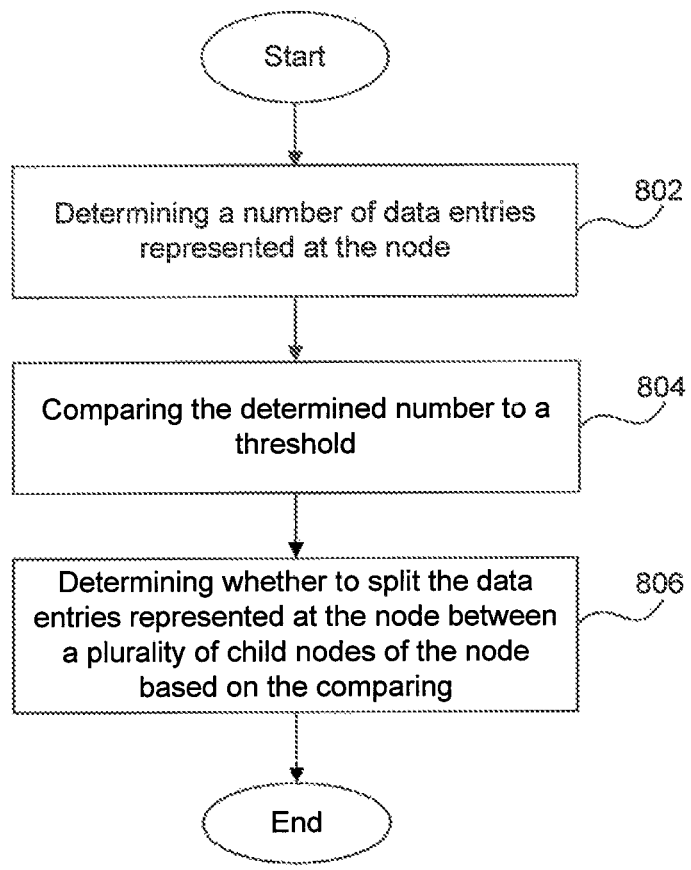
FIG. 8 is a flowchart of a method to determine whether to grow the decision tree of FIG. 5, in accordance with an embodiment.

FIG. 8 is a flowchart of a method 800 to determine whether to grow the decision tree of FIG. 5, in accordance with an embodiment. Method 800 can be performed, for example, during step 606 to determine whether any of the current non-intermediate nodes require to be grown. Method 800 may be performed upon each current non-intermediate node.

Method 800 is illustrated with steps 802-806. However, it should be noted that one or more steps 802-806 may not be required or may be performed in an order different from that shown in FIG. 8.

At step 802, the number of data entries represented at a currently selected non-intermediate node is determined. At step 804, the determined number is compared to a threshold maximum per-node number of data entries. The threshold may be preconfigured. The number of data entries represented at the leaf nodes can affect the search time in RAM. Other tests (e.g., RAM required to store the entries) may be used in place of, or in addition to, the number of data entries in order to determine the next node to be processed.

At step 806, based upon the comparison in step 804, it is decided whether to add one or more child nodes to the current node. If the number of data entries at the current node is found to be greater than the threshold, then the current node will be split by adding one or more child nodes. If not, then the current node will not be split and will remain as a leaf node.

Figure 9:
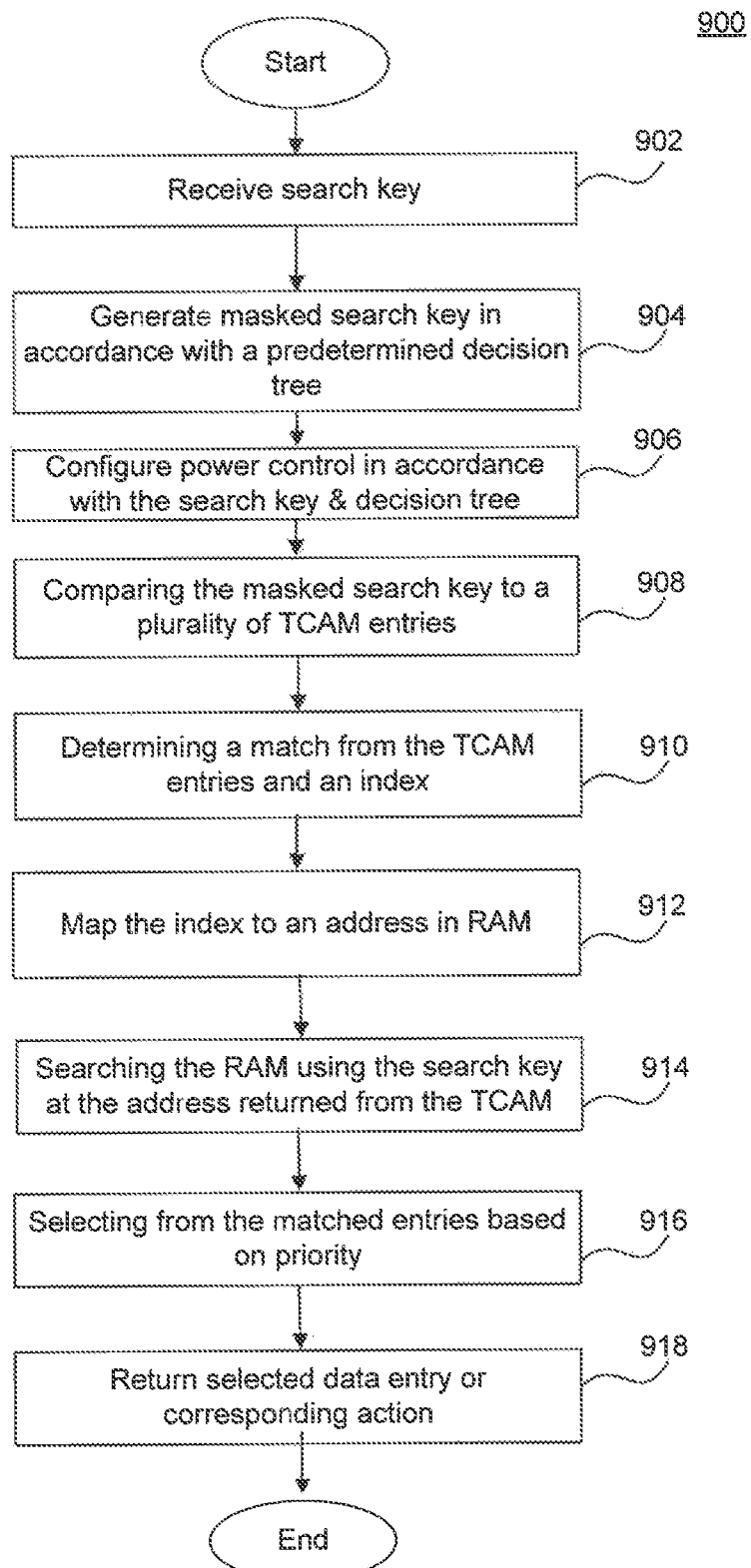
FIG. 9 is a flowchart of a method of searching a hybrid memory device, in accordance with an embodiment.

FIG. 9 is a flowchart of a method 900 of searching a hybrid memory device, in accordance with an embodiment. For example, method 900 may be performed to lookup an ACL table in a hybrid memory device 102 for incoming packets in a network router.

Method 900 is illustrated with steps 902-918. However, it should be noted that one or more steps 902-918 may not be required or may be performed in an order different from that shown in FIG. 9.

Method 900 begins at step 902 when the hybrid memory device receives a search key. The search key may be formed by a processor and/or the hybrid memory device based upon an incoming or outgoing packet. The packet, for example, but without limitation, can be a data packet or control packet in an Internet Protocol (IP)-based network. The packet may be captured for purposes of ACL at any of a plurality of layers in the network protocol stack. Therefore, the packet may be, an Ethernet frame, an IP, transmission control protocol (TCP), user datagram protocol (UDP), or other packet or frame format seen at any of the hierarchy of layers in the network protocol stack. The search key may be formed from one or more headers in the packet. According to an embodiment, the search key includes a copy of two or more contiguous header fields.

At step 904, optionally, the search key may be masked based upon the TCAM against which it will be compared. Masking involves preparing a search key or a copy of the search key to be compared against only the active columns or fields in the TCAM array to which the key would be compared. For example, the width of the decision tree paths encoded in TCAM may be narrower than the width of the search key. As shown in example table 312 of FIG. 3, a comparison of just the leading 4 bits in table 312 is sufficient to distinguish between the different groups of entries.

At step 906, optionally, the TCAM array can be configured to reduce power consumption during the compare operation. In one embodiment, the columns in the TCAM array that are known to be not useful in the comparison may not be powered on for the search operation. For example, columns with all "don't care" values may not be powered. For example, if an exemplary TCAM encoded triggers 312 shown in FIG. 3, then bit positions 2, and 5-7 has all "don't care" values and may therefore be powered down for the duration of the compare operation in order to reduce the power consumption.

In another embodiment, based upon a preliminary analysis of the search key one or more data entries and/or blocks may not be powered on (or may be powered down) in the TCAM. For example, if the search key starts with a value of 1 in the first bit position, then any TCAM entries that start with a value of 0 in the first bit position can remain without being powered on for the search. Because data entries are grouped and stored in accordance with the leaf nodes in the decision tree, one or more blocks of TCAM entries may be powered down based upon characteristics of the search key.

At step 908, the search key or the masked search key is compared to the TCAM array that encodes the decision tree. In an embodiment, the TCAM array stores only a portion of each data entry, e.g. only the portion of each data entry of a length that corresponds to the longest path from the root to a leaf node in the decision tree. Some embodiments may have a portion longer than the longest path in the decision tree stored in the TCAM.

At step 910, an index is returned from the search of the TCAM. According to an embodiment, the returned index corresponds to the TCAM entry that matched the search key or masked key which was compared to the TCAM array. In embodiments, due to the characteristics of the decision tree, a search key or masked search key can match only one leaf node. Therefore, the search of the TCAM returns a maximum of one index.

At step 912, an address and/or an area in RAM that corresponds to the index returned by the TCAM is determined. This determination may be based upon an indirection table or other table that maps respective indexes from the TCAM to an address or area in the RAM. In one embodiment, the index from the TCAM is mapped to a start address and a length in the RAM. In another embodiment, the index is mapped to a start address and an end address in the RAM.

At step 914, the RAM is accessed at the address and/or area determined in step 910. The accessed RAM area is searched for a match for the search key.

The search of the RAM may include reading a block of memory storing one or more data entries into a register memory and performing a comparison against the search key. If any matches are found, the matching one or more entries are returned.

At step 916, one matching entry is selected from the one or more matching entries returned in step 912. The selection is based upon the priority of the respective entries that are returned in step 912. The priorities of the entries may have been preconfigured either automatically or manually by a user.

At step 918, the selected data entry or a corresponding processing action is returned. For example, the selected data entry or information associated with the selected data entry can specify a location in memory where an associated processing action is specified.

Method 900 is described above primarily with respect to one branch of multiple parallel branches of computation, such as 232 in FIG. 2. It should be noted that multiple instances of steps 904-916 can be performed and the results combined before being returned to the user.

Figure 10:
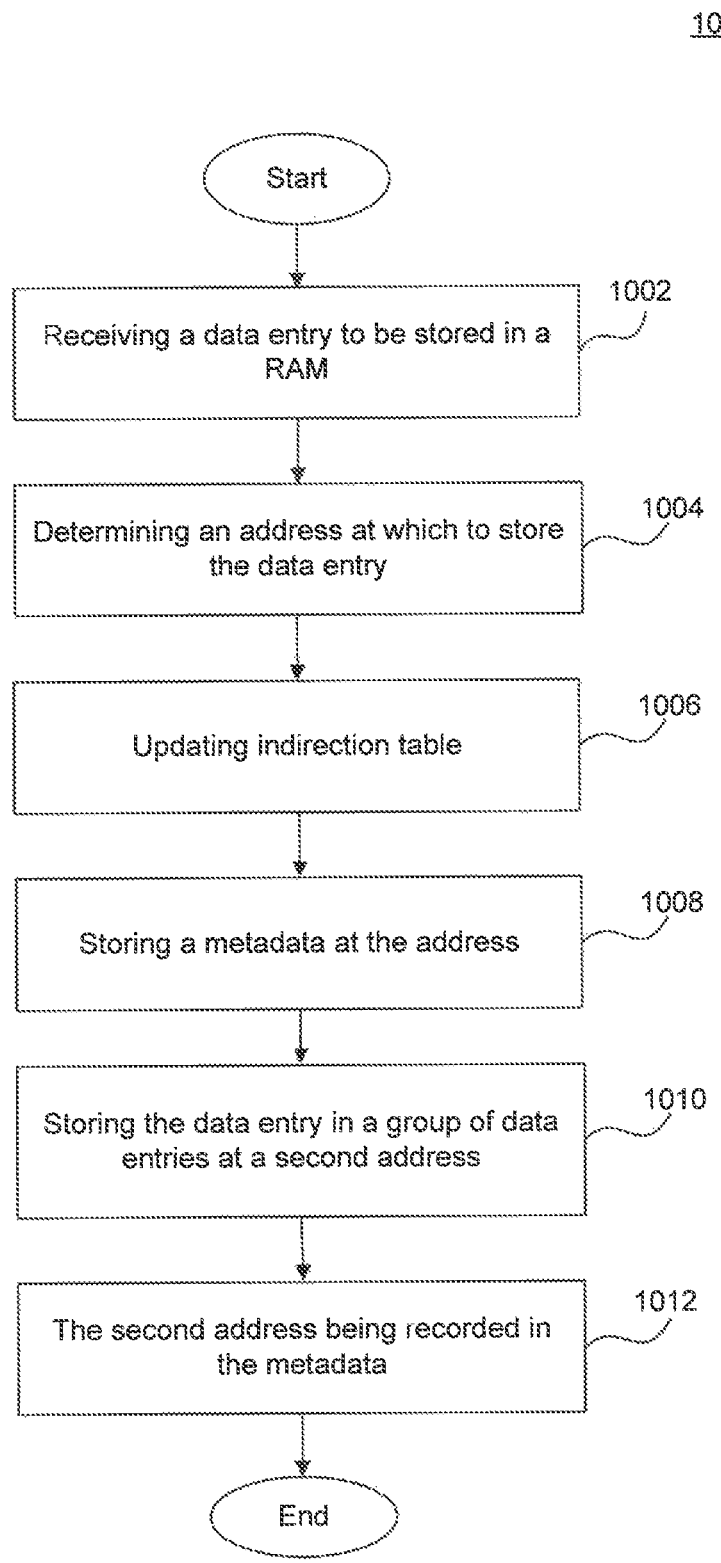
FIG. 10 is a flowchart of a method of compressing data entries in the hybrid memory device of FIG. 2, in accordance with an embodiment.

FIG. 10 is a flowchart of a method 1000 of compressing data entries in the hybrid memory device of FIG. 2, in accordance with an embodiment.

Method 1000 is illustrated with steps 1002-1012. However, it should be noted that one or more steps 1002-1012 may not be required or may be performed in an order different from that shown in FIG. 10.

Method 1000 begins at step 1002 when a data entry, such as but not limited to an ACL entry, is received to be stored in a RAM or other associative memory. The ACL entry to be stored in the RAM may be received subsequent that ACL being processed in a decision tree forming process, such as that described in relation to FIG. 6 above. Method 1000 may be performed, for example, during step 510 of method 500 to store one or more second bit patterns in a RAM.

At step 1004, an address in RAM at which to store the received data entry is determined. The address may be determined based upon factors such as, but not limited to, the following. Data entries represented in the same leaf node of the decision tree are stored contiguously. The size of each data entry and the width of the RAM that can be read in a single read operation can be considered.

At step 1006, an indirection table may be updated if needed. For example, the indirection table may map from the TCAM index of the corresponding leaf of the decision tree to the area in the RAM where the data entries represented at the leaf are stored. The indirection table may be updated with the start address of the area when the first entry represented at the leaf node is stored in the RAM. When subsequent data entries that are represented at the same leaf node are considered, the indirection table may be updated to include a new end address and/or size of the corresponding area. The indirection table may be used to virtualize the layout of data entries in the RAM.

At step 1008, a metadata tag is formed for the data entry to be stored, and the metadata is stored at a location based upon the start address. The metadata tags, as described above in relation to FIG. 4, are of fixed size. As shown in metadata tag 432, a metadata tag can include an offset, an associated data index, and a priority. The offset specified where the actual data entry or a header part of that data entry is stored. Associated data indicates where any actions and/or rules associated with the data entry are specified. The priority indicates a priority assigned to the data entry.

At step 1010, the data entry is stored at a location with other data entries in RAM. As described below in relation to FIG. 11, a data entry is stored at an offset pointed to by a corresponding metadata tag, and includes a header part and a body part. At step 1012, the offset at which the data entry or header part of the data entry is stored is recorded in the metadata tag. Moreover, for some entries no suitable location in RAM may be found at step 1002 (e.g., because they have don't care bits where triggers check values or because the node they would map to is already full (or the RAM is full)) and they are placed into DBA as outliers.

Figure 11:
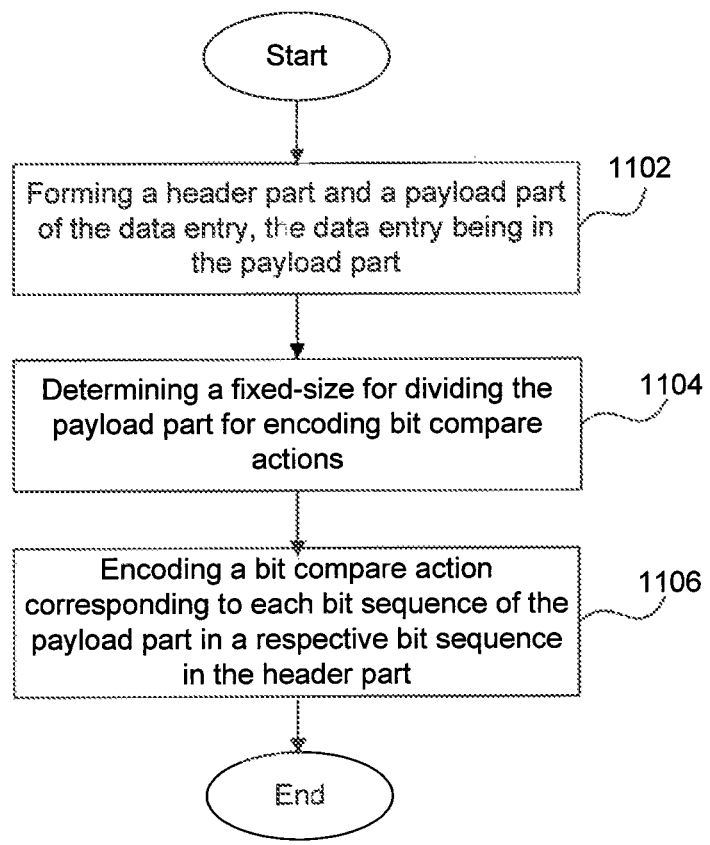
FIG. 11 is a flowchart further detailing the compressing of data entries in the hybrid memory device of FIG. 2, in accordance with an embodiment.

FIG. 11 is a flowchart further detailing the compressing of data entries in the hybrid memory device of FIG. 2, in accordance with an embodiment. Method 1100 can be used, for example, during the storing of the data entry in step 1010 described above.

Method 1100 is illustrated with steps 1102-1106. However, it should be noted that ore or more steps 1102-1106 may not be required or may be performed in an order different from that shown in FIG. 11.

Method 1100 begins at step 1102. At step 1102, a header part and a body part are formed for a data entry that is to be stored in the RAM. The data entry, such as an ACL entry, is stored in the body part.

At step 1104, determine a size of a part such that the body part can be divided to n equal-sized parts. The size may be preconfigured. According to another embodiment, the size may be determined dynamically determined based upon the size of the data entries stored in RAM. The size may be determined, for example, based upon the size of fields to be considered. For example, in IP-based networks, and therefore in ACL operations in such networks, many fields that are compared such as IP addresses and port numbers are usually 16-bits, 32-bits or other multiple of 16-bits. Therefore, in networks such as IP networks, 16 bits is a suitable size for subdividing the body part.

At step 1106, for each equal-sized part in the body part, a respective bit comparing action is encoded in the header part. The bit comparing action can be, for example, any of an exact match, longest prefix match, less than, greater than, equal, and "don't care". According to an embodiment, a 3-bit code specifying the bit comparing action that corresponds to each equal-sized part of the body is stored in the header part.

In another embodiment, data entries may be stored in RAM without explicitly storing a header and a body for each entry. For example, a common structure can be described for all entries in a header shared by all data entries.

Figure 12:
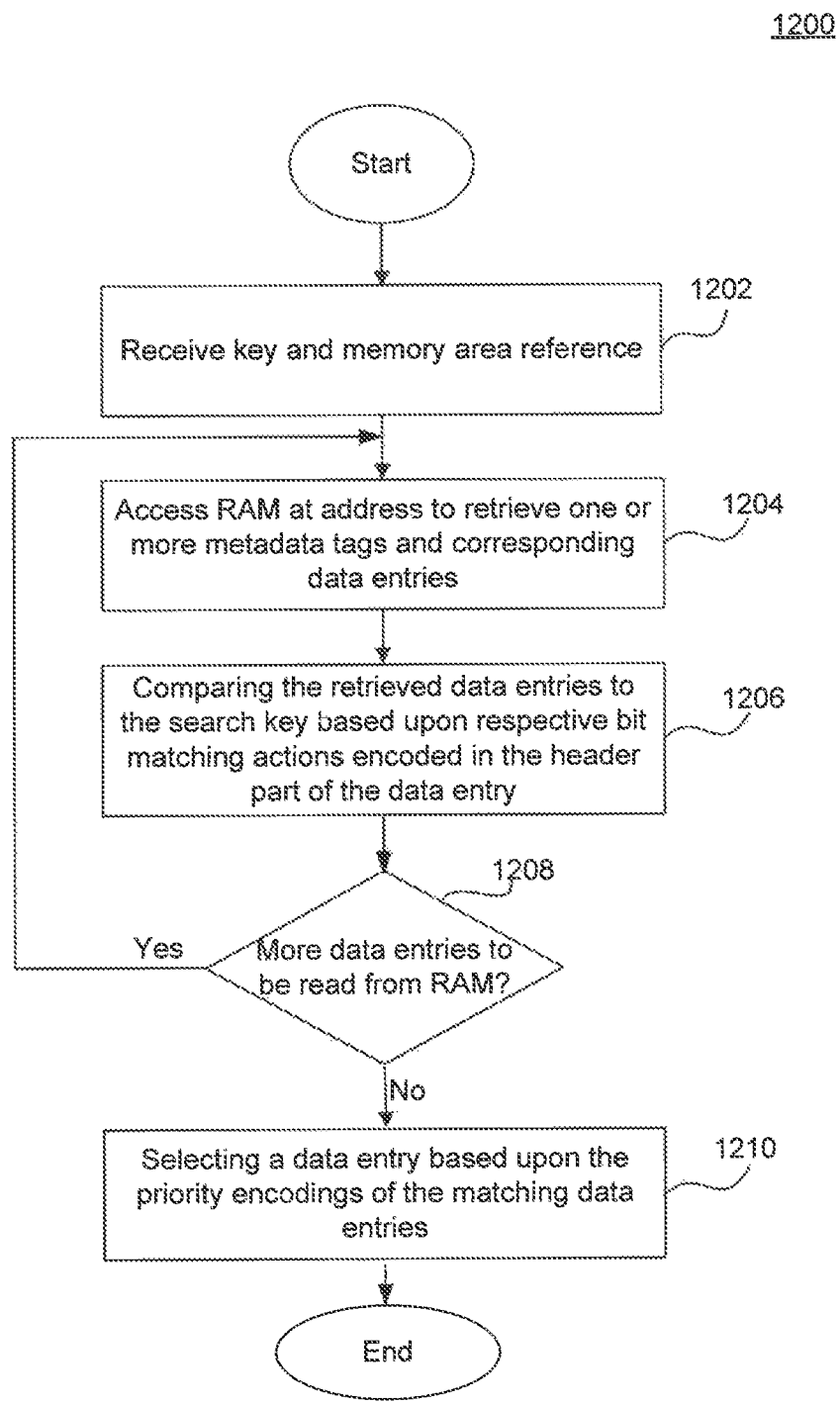
FIG. 12 is a flowchart of a method of searching compressed data entries in the hybrid memory, in accordance with an embodiment.

FIG. 12 is a flowchart of a method 1200 of searching the hybrid memory, in accordance with an embodiment of the invention. Method 1200 may be performed after the TCAM lookup identifies an area in RAM where the corresponding data entry may be stored.

Method 1200 is illustrated with steps 1202-1210. However, it should be noted that one or more steps 1202-1210 may not be required or may be performed in an order different from that shown in FIG. 12. Method 1200 is described for sequential searching. However, in some embodiments, non-sequential techniques for comparing the search key against the entries stored in RAM may be used.

Method 1200 begins at step 1202. At step 1202, a search key and corresponding memory address information is received. The search key received at step 1202 may include all fields included in the ACL data entries. The memory address information can be the start address and area information identified based upon the TCAM lookup.

At step 1204, the RAM is accessed using the memory information received at step 1202. The RAM is accessed at the starting address returned from the TCAM lookup. According to an embodiment, at each starting address mapped to a TCAM index, one or more metadata tags are stored contiguously. Each of the metadata tags points to a data entry, such as a stored ACL entry.

In this step, according to an embodiment, based upon a memory read size that may be configured, one or more metadata tags and corresponding data entries are read from the RAM.

At step 1206, each of the retrieved data entries are compared to the search key. Each of the data entries that are read includes a header part and a data part. The compare operation for each data entry is based upon the hit comparing actions encoded in the header part. More specifically, for each data entry, each fixed-size sequence of bits from the search key is compared to a corresponding fixed-size sequence of bits from the body part of the data entry based upon a respective corresponding bit comparing action encoded in the header part of the same data entry.

A data entry successfully compares to the search key when all the respective fixed-size sequences of bits of the search key match the corresponding fixed-size sequence of bits from that data entry in accordance with the respective corresponding bit comparing action from the header part.

At step 1208, it is determined whether all the data entries corresponding to the matched TCAM index have been compared to the search key. If not, method 1200 proceeds to step 1204 to access yet unread metadata tags and corresponding data entries. Steps 1204-1208 are repeated until all data entries stored corresponding to the matched TCAM are read and compared to the search key.

When it is determined at step 1208 that all the data entries corresponding to the matched TCAM index have been read and compared to the search key, method 1200 proceeds to step 1210.

At step 1210, if any matches were found in step 1206, a data entry is selected to be returned as the matching entry to the search key. The selection of the data entry is based upon the priority of each data entry as encoded in the corresponding metadata tag.

The representative functions of the communications device described herein may be implemented in hardware, software, or some combination thereof. For instance, methods 500, 600, 700, 800, 900, 1000, 1100, and 1200 can be implemented using computer processors, computer logic, ASIC, FPGA, DSP, etc., as will be understood by those skilled in the arts based on the discussion given herein. Accordingly, any processor that performs the processing functions described herein is within the scope and spirit of the present invention.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method, comprising:
    storing a plurality of data entries in a memory, each of the stored plurality of data entries including a header part and a body part; and
    encoding each of a plurality of bit sequences in the header part of at least one of the stored plurality of data entries to indicate a bit comparing action associated with a respective bit sequence in the body part of the at least one of the stored plurality of data entries.

2. The method of claim 1, wherein the encoding comprises:
    encoding respective bit sequences in the header part with bit comparing actions of an exact match and of a ternary match.

3. The method of claim 1, wherein the encoding comprises:
    encoding respective bit sequences in the header part with bit comparing actions of a longest prefix match and of a ternary match.

4. The method of claim 1, wherein the bit comparing action is one of an exact match, a greater than match, a less than match, a longest prefix match, or a ternary match.

5. The method of claim 1, wherein the body part of the data entry comprises an access control list (ACL) entry.

6. The method of claim 1, wherein storing the plurality of data entries comprises:
    forming the plurality of data entries into groups in a first area of the memory; and
    forming, for each of the groups, a plurality of fixed-length metadata tags in a respective second area of the memory, wherein each of the plurality of fixed-length metadata tags includes a pointer to a data entry from the plurality of data entries.

7. The method of claim 6, wherein each of the plurality of fixed-length metadata tags further includes a priority associated with a data entry.

8. The method of claim 6, wherein each of the plurality of fixed-length metadata tags further includes a pointer to associated data.

9. The method of claim 6, wherein each of the groups is stored in a contiguous area of the first area of the memory, and wherein the plurality of fixed-length metadata tags is stored in a contiguous area of the respective second area of memory.

10. The method of claim 6, wherein the first and second areas of the memory are random access memories (RAM).

11. The method of claim 6, wherein storing the plurality of data entries further comprises:
forming a search table entry corresponding to one of the groups;
inserting the search table entry in a content addressable memory (CAM); and
associating an index of the search table entry from the CAM with an address of the respective second area of memory corresponding to the one of the groups.

12. The method of claim 11, wherein forming a search table entry comprises:
forming a decision tree based upon data entries including the plurality of data entries, wherein all data entries in the one of the groups are represented at a particular leaf of the decision tree; and
determining the search table entry based upon a path from a root of the decision tree to the particular leaf.

13. A system, comprising:
a ternary content addressable memory (TCAM);
a random access memory (RAM); and
a hybrid memory lookup table encoder configured to:
store a plurality of data entries in the RAM, each of the stored plurality of data entries including a header part and a body part; and
encode each of a plurality of bit sequences in the header part of at least one of the stored plurality of data entries to indicate a bit comparing action associated with a respective bit sequence in the body part of the at least one of the stored plurality of data entries.

14. The system of claim 13, wherein the hybrid memory lookup table encoder is further configured to:
form the plurality of data entries into groups in a first area of the memory; and
form, for each of the groups, a plurality of fixed-length metadata tags in a respective second area of the memory, wherein each of the plurality of fixed-length metadata tags includes a pointer to a data entry from the plurality of data entries.

15. The system of claim 14, further comprising:
a search unit configured to:
receive a search key and a first memory address;
access a fixed-length metadata tag at the first address;
retrieve a group of stored data entries using a second memory address encoded in the fixed-length metadata tag;
compare each bit sequence from the search key to a respective bit sequence from each stored data entry from the group based upon a bit comparing action encoded in a corresponding bit sequence in a header part of the stored data entry; and
select one of the stored data entries based upon the comparing.

16. The system of claim 15, wherein the search unit is further configured to select one of the stored data entries based further upon a priority encoding in the fixed-length metadata tag.

17. A non-transitory computer readable storage medium storing instructions that, when executed by a processor, causes the processor to perform a method comprising:
storing a plurality of data entries in a memory, each of the stored plurality of data entries including a header part and a body part; and
encoding each of a plurality of bit sequences in the header part of a stored data entry from the plurality of data entries to indicate a bit comparing action associated with a respective bit sequence in the body part of the stored data entry.

18. The non-transitory computer readable storage medium of claim 17, wherein the encoding comprises:
encoding respective bit sequences in the header part with bit comparing actions of an exact match and of a ternary match.

19. The non-transitory computer readable storage medium of claim 17, wherein the encoding comprises:
encoding respective bit sequences in the header part with bit comparing actions of a longest prefix match and of a ternary match.

20. The non-transitory computer readable storage medium of claim 17, wherein the bit comparing action is one of an exact match, a greater than match, a less than match, a longest prefix match, or a ternary match.

* * * * *